United States Patent
Yang et al.

(10) Patent No.: US 9,510,466 B2
(45) Date of Patent: Nov. 29, 2016

(54) ELECTRONIC CONTROL APPARATUS FOR VEHICLE USING COUPLING MEMBER AND METHOD FOR MANUFACTURING THE SAME

(71) Applicant: Hyundai Autron Co., Ltd., Seongnam-si (KR)

(72) Inventors: Sun Jae Yang, Uiwang-si (KR); Dong Gi Lee, Uiwang-si (KR); Seung Mok Song, Seongnam-si (KR); Yeon Chul Choo, Seoul (KR)

(73) Assignee: HYUNDAI AUTRON CO., LTD., Seongnam-Si (KR)

( * ) Notice: Subject to any disclaimer, the term of this patent is extended or adjusted under 35 U.S.C. 154(b) by 126 days.

(21) Appl. No.: 14/565,396

(22) Filed: Dec. 9, 2014

(65) Prior Publication Data

US 2016/0095235 A1 Mar. 31, 2016

(30) Foreign Application Priority Data

Sep. 30, 2014 (KR) .......................... 10-2014-0131925

(51) Int. Cl.
*H05K 5/00* (2006.01)

(52) U.S. Cl.
CPC ............ *H05K 5/006* (2013.01); *H05K 5/0039* (2013.01)

(58) Field of Classification Search
None
See application file for complete search history.

(56) References Cited

U.S. PATENT DOCUMENTS

| | | | | | |
|---|---|---|---|---|---|
| 5,272,593 | A | * | 12/1993 | Jakob | H05K 7/20854 361/707 |
| 5,577,768 | A | * | 11/1996 | Taguchi | B60R 21/2035 280/728.2 |
| 6,094,349 | A | * | 7/2000 | Fassel | H05K 3/284 165/80.2 |

(Continued)

FOREIGN PATENT DOCUMENTS

| | | |
|---|---|---|
| DE | 10 2008 054 384 A1 | 6/2010 |
| DE | 10 2009 040 915 A1 | 4/2011 |
| DE | 10 2010 062 586 A1 | 6/2012 |

OTHER PUBLICATIONS

Deutsches Patent and Management Office, Office Action for German Patent Application No. 10 2014 118 044.5, Aug. 10, 2015.

(Continued)

*Primary Examiner* — Courtney Smith
*Assistant Examiner* — Rashen E Morrison
(74) *Attorney, Agent, or Firm* — Mayer Brown LLP; Hyunho Park (57) ABSTRACT

Disclosed is an electronic control apparatus for a vehicle, comprising: a printed circuit board (PCB) configured to electrically control each part of the vehicle and have both sides provided with at least one fixed hole; a connector cover includes a connector part electrically connected and coupled with the PCB and a coupling part; a housing configured of a one-piece slot type and receiving the PCB inserted in a slide form; and at least one coupling member each fastened with at least one fixed hole of the PCB, wherein the PCB is inserted into the housing and the PCB adheres to a bottom side of the housing by the coupling member which is pressed by physically deforming each corresponding surface of the housing corresponding to at least one coupling member.

9 Claims, 9 Drawing Sheets

(56) References Cited

U.S. PATENT DOCUMENTS

| | | | | | |
|---|---|---|---|---|---|
| 6,628,523 | B2* | 9/2003 | Kobayashi | ............ | H05K 5/0047 |
| | | | | | 361/736 |
| 6,717,051 | B2* | 4/2004 | Kobayashi | .......... | B60R 16/0239 |
| | | | | | 174/535 |
| 7,140,885 | B2* | 11/2006 | Kitamura | ............. | H05K 5/0039 |
| | | | | | 361/752 |
| 7,190,589 | B2* | 3/2007 | Caines | ................. | H05K 5/061 |
| | | | | | 174/16.1 |
| 7,413,463 | B2* | 8/2008 | Matsuo | ............... | H05K 5/0039 |
| | | | | | 439/377 |
| 7,417,868 | B2* | 8/2008 | Morisada | ............. | H05K 7/1405 |
| | | | | | 361/741 |
| 7,699,622 | B2* | 4/2010 | Sakamoto | ............ | H01R 13/629 |
| | | | | | 439/76.1 |
| 7,813,134 | B2* | 10/2010 | Katsuro | ............. | H05K 7/20454 |
| | | | | | 165/104.33 |
| 8,184,438 | B2* | 5/2012 | Kaneko | ............. | H05K 7/20854 |
| | | | | | 165/80.2 |
| 8,408,945 | B2* | 4/2013 | Schober | ............... | H05K 5/0039 |
| | | | | | 439/660 |
| 8,942,001 | B2* | 1/2015 | Kawai | ................. | H05K 5/0052 |
| | | | | | 174/50.5 |
| 9,093,776 | B2* | 7/2015 | Yamanaka | ........... | H05K 5/0069 |
| 9,293,870 | B1* | 3/2016 | Koczwara | ........... | H01R 12/724 |
| 9,313,936 | B2* | 4/2016 | Seok | ................... | H05K 13/0023 |
| 2004/0212974 | A1* | 10/2004 | Ice | ....................... | G02B 6/4277 |
| | | | | | 361/801 |
| 2008/0074840 | A1* | 3/2008 | Suzuki | ................ | H05K 5/0047 |
| | | | | | 361/679.46 |
| 2009/0068862 | A1* | 3/2009 | Honda | ................ | H05K 5/0052 |
| | | | | | 439/78 |
| 2009/0103267 | A1* | 4/2009 | Wieland | ............ | H05K 7/20409 |
| | | | | | 361/707 |
| 2011/0013370 | A1* | 1/2011 | Oota | ....................... | H01L 23/42 |
| | | | | | 361/752 |
| 2011/0228498 | A1* | 9/2011 | Kawai | ............... | H05K 7/20854 |
| | | | | | 361/752 |
| 2012/0190252 | A1* | 7/2012 | Pavlinsky | ........... | H01M 10/425 |
| | | | | | 439/775 |
| 2013/0058044 | A1* | 3/2013 | Watanabe | ............. | H05K 5/006 |
| | | | | | 361/714 |
| 2013/0250521 | A1* | 9/2013 | Kawai | ............... | H05K 7/20854 |
| | | | | | 361/714 |
| 2013/0286606 | A1* | 10/2013 | Watanabe | ........... | H05K 7/1417 |
| | | | | | 361/752 |
| 2014/0065877 | A1* | 3/2014 | Ohhashi | ............... | H05K 5/0052 |
| | | | | | 439/519 |
| 2014/0085839 | A1* | 3/2014 | Nakano | ................ | H05K 5/0052 |
| | | | | | 361/752 |
| 2014/0334115 | A1* | 11/2014 | Yang | ....................... | H05K 5/06 |
| | | | | | 361/752 |
| 2014/0334116 | A1* | 11/2014 | Lee | ..................... | H05K 5/0052 |
| | | | | | 361/752 |
| 2014/0362533 | A1* | 12/2014 | Shin | ..................... | H05K 7/2039 |
| | | | | | 361/707 |
| 2015/0022976 | A1* | 1/2015 | Ott | ........................ | H01L 23/057 |
| | | | | | 361/736 |
| 2015/0146347 | A1* | 5/2015 | Lee | ................... | H01R 13/5202 |
| | | | | | 361/679.01 |
| 2015/0250072 | A1* | 9/2015 | Ichikawa | ............... | H05K 5/063 |
| | | | | | 439/587 |

OTHER PUBLICATIONS

Deutsches Patent and Management Office, Office Action for German Patent Application No. 10 2014 118 044.5, Oct. 8, 2015.

* cited by examiner

ELECTRONIC CONTROL APPARATUS FOR VEHICLE USING COUPLING MEMBER AND METHOD FOR MANUFACTURING THE SAME

CROSS-REFERENCE TO RELATED APPLICATIONS

This application claims priority to and the benefit of Korean Patent Application No. 10-2014-0131925 filed in the Korean Intellectual Property Office on Sep. 30, 2014, the entire contents of which are incorporated herein by reference.

TECHNICAL FIELD

The present disclosure relates to an electronic control apparatus for a vehicle using a coupling member and a method for manufacturing the same, and more particularly, to an electronic control apparatus for a vehicle and a method for manufacturing the same capable of fixing a printed circuit board (PCB) within a housing using the coupling member.

BACKGROUND ART

Generally, an electronic control apparatus such as an electronic control unit (ECU) which electronically controls various apparatuses is equipped in a vehicle. The electronic control apparatus receives information from sensors or switches which are equipped in each part of a vehicle and processes the received information to serve to improve riding comfort and safety of the vehicle or perform various electronic controls for providing various conveniences to a driver and passengers.

For example, the electronic control apparatus such as the ECU which controls a state of an engine, an automatic transmission, an anti-lock brake system, and the like of the vehicle using a computer serves to control all the parts of the vehicle, such as a driving system, a braking system, and a steering system, as well as controlling the automatic transmission, with the development of performance of the vehicle and the computer.

The electronic control apparatus such as the ECU is configured to include a case with an upper cover and a lower base, a printed circuit board (PCB) received in the case, a connector coupled with a front end of the PCB for external socket connection.

The case has a structure in which the cover and the base are assembled together while covering the PCB, in particular, the connector interposed between the cover and the base at the time of assembling the cover and the base has a sealing structure with the cover side and the base side.

The electronic control apparatus has a highly integrated control circuit means and thus requires a predetermined sealing structure to be able to prevent external moisture or foreign objects from being introduced thereinto. The electronic control apparatus mainly adopts the sealing structure for protecting the PCB, and the like therein in a scheme of assembling the cover and the base together with the connector, in the state in which a sealing agent is inserted into the coupling portion among the cover, the base, and the connector.

Meanwhile, the electronic control apparatus may be assembled by being inserted into a housing in a slide form. In this case, in the electronic control apparatus in a one-piece housing form, when the PCB is assembled by being slid inside the housing, the PCB is not fixed within the housing.

In particular, when a one-piece slot type housing is made of a metal material, the PCB inserted into the housing is not fixed but may vibrate or move as much as a gap of the housing. The electronic control apparatus is equipped in the vehicle and therefore may severely vibrate. Therefore, the electronic control apparatus configured of the one-piece slot type housing may be damaged due to the vibration of the vehicle.

SUMMARY OF THE INVENTION

The present disclosure has been made in an effort to provide an electronic control apparatus for a vehicle and a method for manufacturing the same capable of fixing a printed circuit board (PCB) within a one-piece slot type housing using the coupling member.

However, an object of the present disclosure is not limited to the foregoing matters and other objects of the present disclosure which are not mentioned may be clearly understood to those skilled in the art from the following description.

A first exemplary embodiment of the present disclosure provides an electronic control apparatus for a vehicle, comprising: a printed circuit board (PCB) configured to electrically control each part of the vehicle and have both sides provided with at least one fixed hole; a connector cover includes a connector part electrically connected and coupled with the PCB and a coupling part; a housing configured of a one-piece slot type and receiving the PCB inserted in a slide form; and at least one coupling member each fastened with at least one fixed hole of the PCB, wherein the PCB is inserted into the housing and the PCB adheres to a bottom side of the housing by the coupling member which is pressed by physically deforming each corresponding surface of the housing corresponding to at least one coupling member.

The coupling member is a nut configured of a head formed with a groove and a body and the groove is pressed to a corresponding surface of the physically deformed housing.

The coupling member includes a head formed with a groove and the head is wider than the fixed hole.

The coupling part of the connector cover is provided with a groove and the corresponding surface of the housing contacting the groove formed at the coupling part, and the corresponding surface of the housing is physically deformed to press the groove to couple the coupling part with the housing.

A sealing member is inserted between the coupling part and the housing and an inner surface of the coupling part has a structure enclosing a portion of the inserted sealing member so as to seal a coupled portion between the coupling part and the housing.

The inner surface of the coupling part having a structure enclosing a portion of the inserted sealing member has teeth.

The sealing member is made of a rubber, synthetic resin, or liquid phase sealant material and seals a coupled surface between the coupling part and the housing in a L shape form to enclose the coupled surface therebetween.

A second exemplary embodiment of the present disclosure provides a method for manufacturing an electronic control apparatus for a vehicle of a one-piece slot type including a printed circuit board (PCB), a connector, and a housing, the method comprising: coupling the PCB electrically controlling each part of the vehicle with a connector cover; inserting the PCB into the housing in a slide form;

and inserting a sealing member between the connector cover and the housing, wherein the coupling part of the connector cover has a structure enclosing a portion of the inserted sealing member so that a coupled portion between the coupling part and the housing is sealed.

The method further comprising: forming at least one fixed hole on the PCB; after the coupling of the PCB with the connector cover, fastening at least one fixed hole of the PCB with at least one coupling member, respectively, and inserting the PCB fastened with the coupling member into the housing; and adhering the PCB to a bottom side of the housing by the coupling member pressed by physically deforming each corresponding surface of the housing corresponding to at least one coupling member.

The coupling member includes a head formed with a groove and the head is wider than the fixed hole.

The method further comprising: forming a groove at the coupling part of the connector cover; and physically deforming the corresponding surface of the housing contacting the groove to press the groove and couple the coupling part with the housing.

According to the exemplary embodiments of the present specification, it is possible to adhere the PCB within the one-piece slot type housing to the bottom side of the housing by the pressed coupling member which is pressed by physically deforming each corresponding surface of the housing corresponding to the coupling member.

According to the exemplary embodiments of the present specification, it is possible to easily couple the coupling part with the housing by the formed corresponding surface of the housing and the pressed depressed groove, by forming the depressed groove at the coupling part of the cover and pressing the depressed groove by physically deforming the corresponding surface of the housing which contacts the depressed groove formed at the coupling part.

According to the exemplary embodiments of the present specification, it is possible to implement the sealed housing and improve the sealing performance by easily sealing the coupled portion between the coupling part and the housing, by forming the structure in which the sealing member is inserted between the coupling part and the housing and the inner surface of the coupling part partially encloses the inserted sealing member.

According to at least some of the exemplary embodiments of the present specification, it is possible to simplify the assembling process by performing the assembling without using additional parts such as a screw and save costs by removing the fastening parts.

The foregoing summary is illustrative only and is not intended to be in any way limiting. In addition to the illustrative aspects, embodiments, and features described above, further aspects, embodiments, and features will become apparent by reference to the drawings and the following detailed description.

It should be understood that the appended drawings are not necessarily to scale, presenting a somewhat simplified representation of various features illustrative of the basic principles of the invention. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

Hereinafter, exemplary embodiments of the present specification will be described in detail with reference to the accompanying drawings.

In describing exemplary embodiments of the present disclosure, technical contents which are known to the art to which the present specification belongs and are not directly connected with the present specification will not be described. This is to more clearly transmit a gist of the present specification by omitting any unnecessary description.

For the same reason, some components are exaggerated, omitted, or schematically illustrated in the accompanying drawings. Further, the size of each component does not exactly reflect its real size. In each drawing, the same or corresponding components are denoted by the same reference numerals.

According to an exemplary embodiment of the present disclosure, an electronic control apparatus includes a printed circuit board (PCB) electrically controlling each part of a vehicle, for example, an integrated control circuit means such as a PCB, and the like. The electronic control apparatus includes a fixed structure capable of preventing failure of the integrated control circuit means, such as a PCB, due to external vibration. Further, the electronic control apparatus may have a heat radiation structure which emits heat generated from a heat radiation element positioned on the PCB into the air and a housing structure for preventing external moisture or foreign objects from being introduced. The electronic control apparatus has a can type one-piece housing form which has the PCB received therein.

Hereinafter, the electronic control apparatus for a vehicle using a coupling member according to the exemplary embodiment of the present disclosure will be described in detail with reference to the accompanying drawings.

Figure 1:
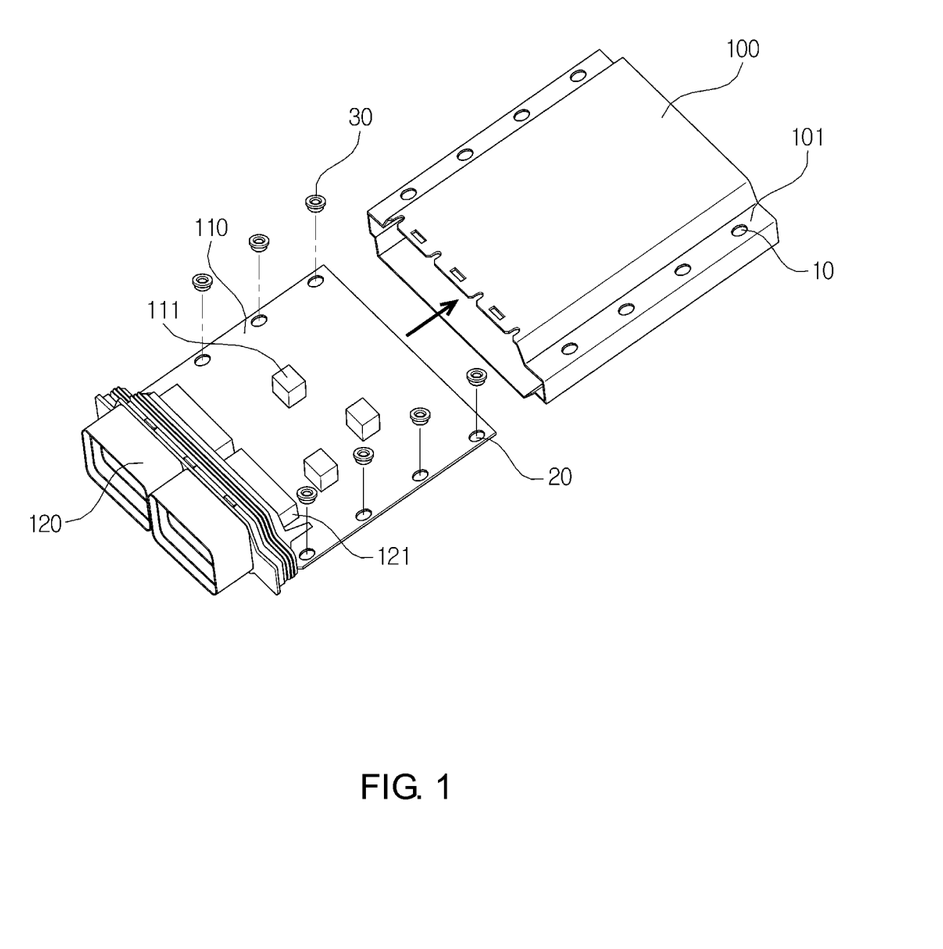
FIG. 1 is a coupling perspective view of an electronic control apparatus for a vehicle using a coupling member according to an exemplary embodiment of the present disclosure.

FIG. 1 is a coupling perspective view of an electronic control apparatus for a vehicle using a coupling member according to an exemplary embodiment of the present disclosure.

As illustrated in FIG. 1, the electronic control apparatus for a vehicle according to the exemplary embodiment of the present disclosure includes a printed circuit board (PCB) 110, a connector cover 120, and a housing 100. Here, after the PCB 110 is coupled, a coupling member 30 fixes the housing 100 and the PCB 110.

The connector cover 120 with which the PCB 110 is coupled is inserted into the housing 100 in a slide form. That is, the housing 100 and the connector cover 120 are coupled with each other in the slide form. After the coupling between the housing 100 and the connector cover 120 is completed, the PCB 100 is inserted into the housing 100 in the slide form. The housing 100 may also include a slide guide 101 for the slot guide when the slot type PCB 110 is inserted into the housing 100 in the slide form.

Here, the housing 100 has a one-piece slot type and receives the PCB 110 which is inserted in the slide form.

The connector cover 120 includes a connector part 121 and a coupling part 122 which are coupled with the PCB 110.

Describing the connector cover 120, a coupling part 122 and the connector part 121 may be a separated type or an integrated type for waterproofing. The coupling part 122 is coupled with the housing 100. The connector part 121 is coupled with the PCB 110 and is electrically connected thereto. The connector part 121 includes a connector pin and is electrically connected to the PCB 110 through the connector pin. The connector pin may include a plurality of inner pins for connecting with the PCB 110 therein and a plurality of outer pins for connecting with the outside. The connector part 121 may be physically inserted into the PCB 110 and may be electrically connected to the PCB 110 by the inner pin. The connector part 121 may have a structure in which a front portion and a rear portion thereof exposed to the outside have an integrated type.

One surface of the PCB 110 may be provided with an electronic control element 111. That is, the PCB 110 may have a top side or a bottom side provided with the electronic control element 111 (for example, electric element or heat radiating element). An outside of the connector cover 120 is connected to the connector part 121 and an inside of the housing 100 is connected to the PCB 110. The housing 100 may have a heat radiating structure and may emit the heat generated from the electronic control element 111 to the outside through the housing 100.

The PCB 110 is provided with a fixed hole 20 which penetrates through the PCB 110. In this configuration, at least one fixed hole 20 is formed at both sides of the PCB 110. At least one coupling member 30 may each be fastened with at least one fixed hole 20 of the PCB 110. That is, the coupling member 30 may be fastened with the fixed hole 20 which is formed on the PCB 110 to fix the PCB 110 within the housing 100. According to the exemplary embodiment of the present disclosure, as the coupling member 30, a support member as a nut may be used.

For example, as illustrated in FIG. 1, both sides of the housing 100 are provided with at least one fixed hole 20. Preferably, as illustrated, four fixed holes 20 may be formed at each of the both sides, respectively, and thus the number of fixed holes 20 may be eight in total, but the present disclosure is not limited to the number of fixed holes 20 illustrated in FIG. 1, and therefore the number of holes may be formed to be eight or less or eight or more.

In the PCB 110, a position corresponding to the fixed hole 20 is provided with a physically deformed corresponding surface 11. When the PCB 110 is inserted into the housing 100 in a slide form, the fixed hole 20 and the corresponding surface 11 corresponding to the fixed hole 20 are disposed to overlap each other.

The coupling member according to the present specification will be described in detail with reference to FIGS. 2 to 4.

Figure 2:
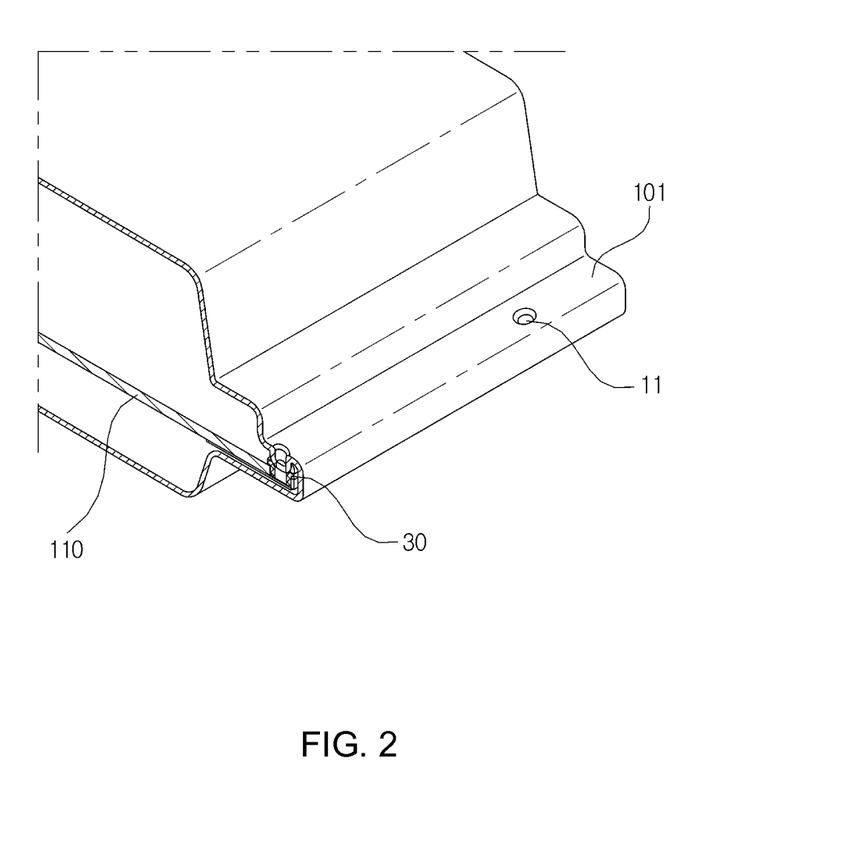
FIGS. 2 to 4 are cross-sectional views illustrating an electronic control apparatus for a vehicle using the coupling member and a structure of the coupling member according to the exemplary embodiment of the present disclosure.
Figure 3:
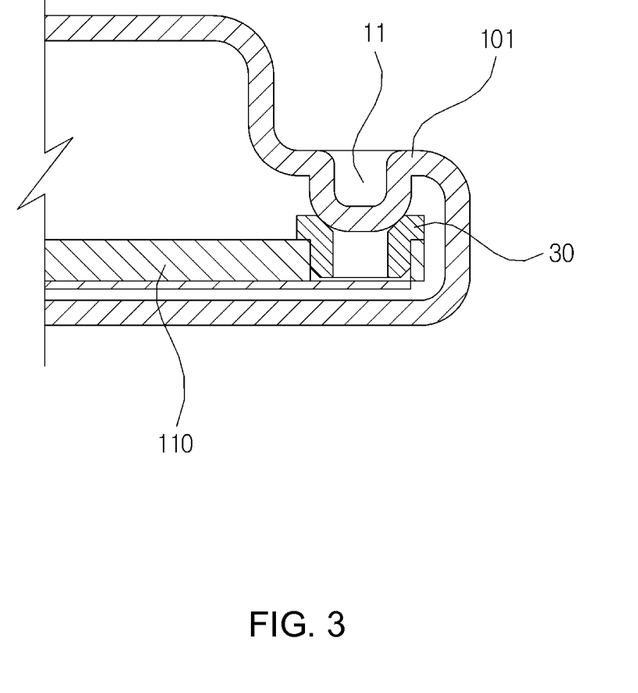
Figure 4:
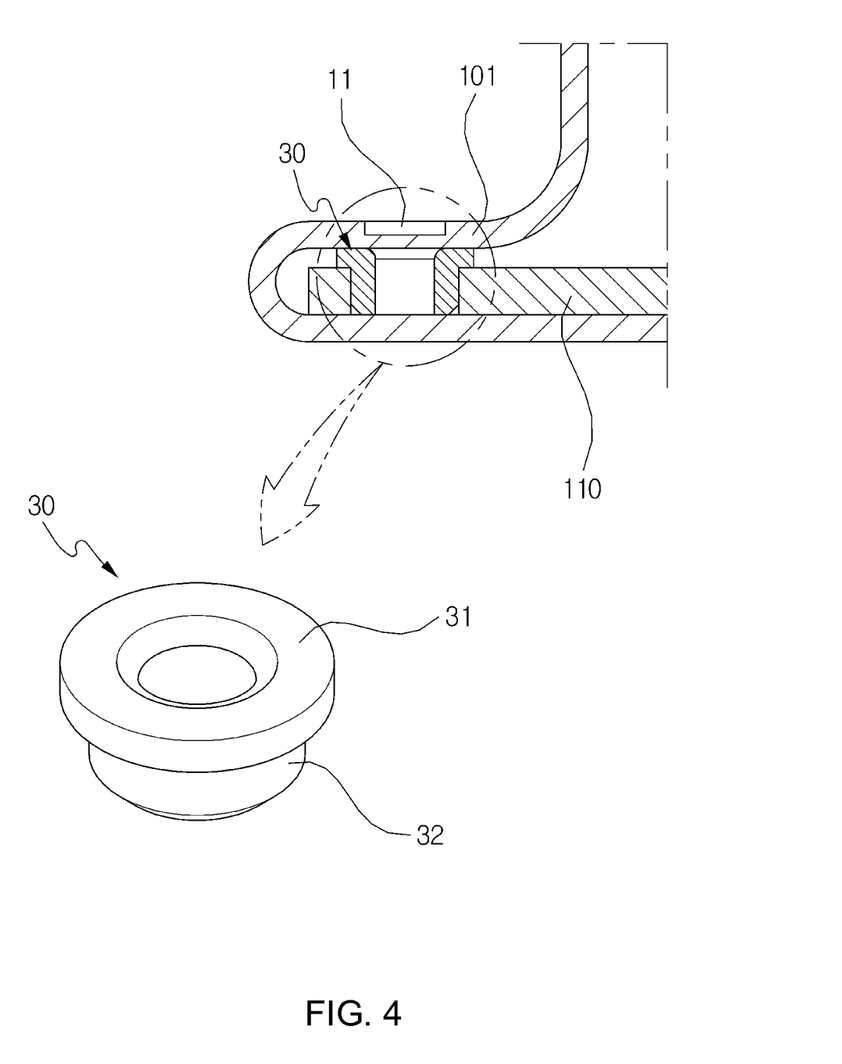

FIGS. 2 to 4 are cross-sectional views illustrating an electronic control apparatus for a vehicle using the coupling member and a structure of the coupling member according to the exemplary embodiment of the present disclosure.

Describing a fastening process of the PCB 110 with the housing 100 with reference to FIGS. 2 and 3, the PCB 110 is inserted into the housing 100. Further, the coupling member 30 is pressed by physically deforming each corresponding surface 11 of the housing 100 which corresponds to at least one coupling member 30. Each corresponding surface 11 of the housing 100 is physically deformed to be caulked downward, thereby applying a pressing force to the coupling member 30.

In this case, each corresponding surface 11 of the housing which is caulked downward presses the coupling member 30 which is formed with a depressed groove. The physical forming of each corresponding surface 11 of the housing 100 presses only the coupling member 30 made of a metal material without pressing the PCB 110 made of a resin material. Therefore, the physical forming of each corresponding surface 11 of the housing 100 on the outside may stably prevent the PCB 110 from being damaged.

Here, the depressed groove may have a shape engaged with each corresponding surface 11 having a U shape which is physically deformed as an example illustrated in FIG. 3.

The depressed groove may have a shape engaged with each corresponding surface 11 having teeth of which the respective corners are angled by being physically deformed as a modified example illustrated in FIG. 4. Next, the PCB 110 may adhere to a bottom side of the housing 100 by the pressed coupling member 30.

As illustrated in FIG. 4, the coupling member 30 is a nut of which the middle is empty and includes a head 31 which is formed with the depressed groove and a body 32. The depressed groove formed at the head 31 is pressed to the corresponding surface 11 of the physically deformed housing.

Here, the head 31 may be formed to be wider as much as a preset width than the fixed hole 20. The head 31 of the coupling member 30 may be formed to be larger than a width of the fixed hole 20 from a portion contacting the PCB 110. By this configuration, when the coupling member 30 is inserted to penetrate through the PCB 110, the coupling member 30 is positioned to be fixed to a top side of the PCB 110, while contacting the PCB 110.

Figure 5:
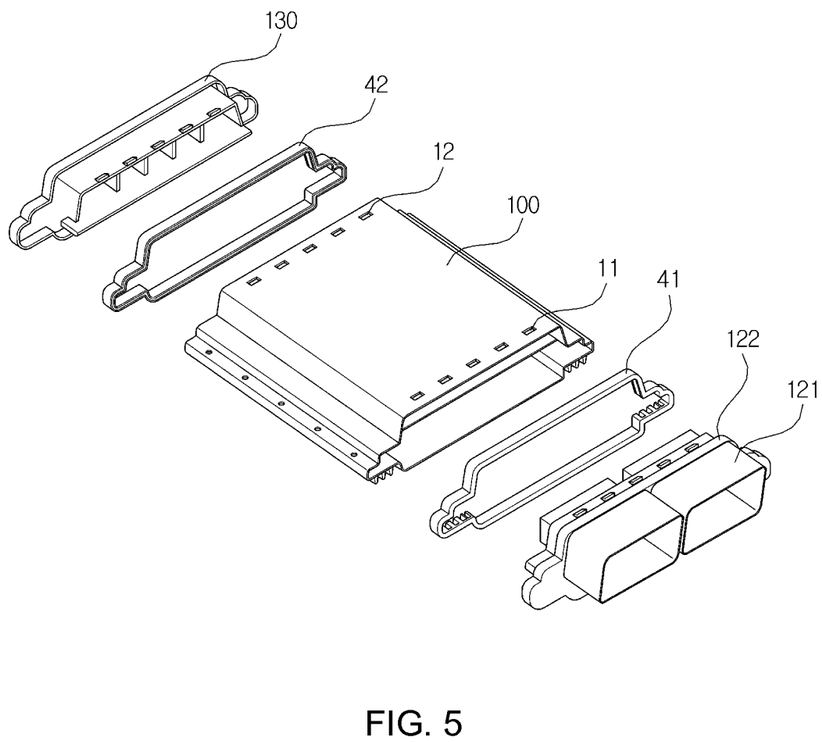
FIG. 5 is a coupling perspective view of an electronic control apparatus for a vehicle including a sealing structure according to an exemplary embodiment of the present disclosure.
Figure 6:
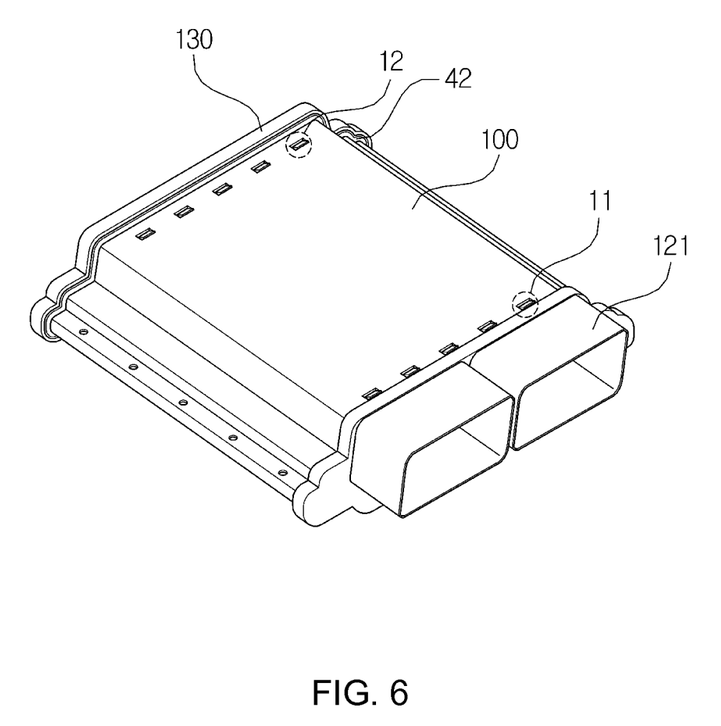
FIG. 6 is a perspective view of the electronic control apparatus for a vehicle including the sealing structure according to the exemplary embodiment of the present disclosure.
Figure 7:
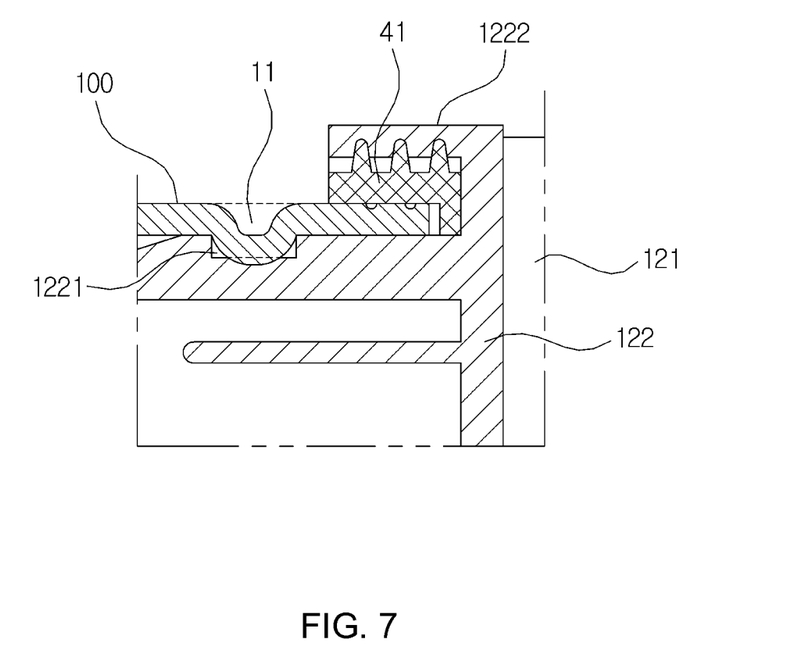
FIGS. 7 and 8 are cross-sectional views illustrating the sealing structure included in the electronic control apparatus for a vehicle according to the exemplary embodiment of the present disclosure.
Figure 8:
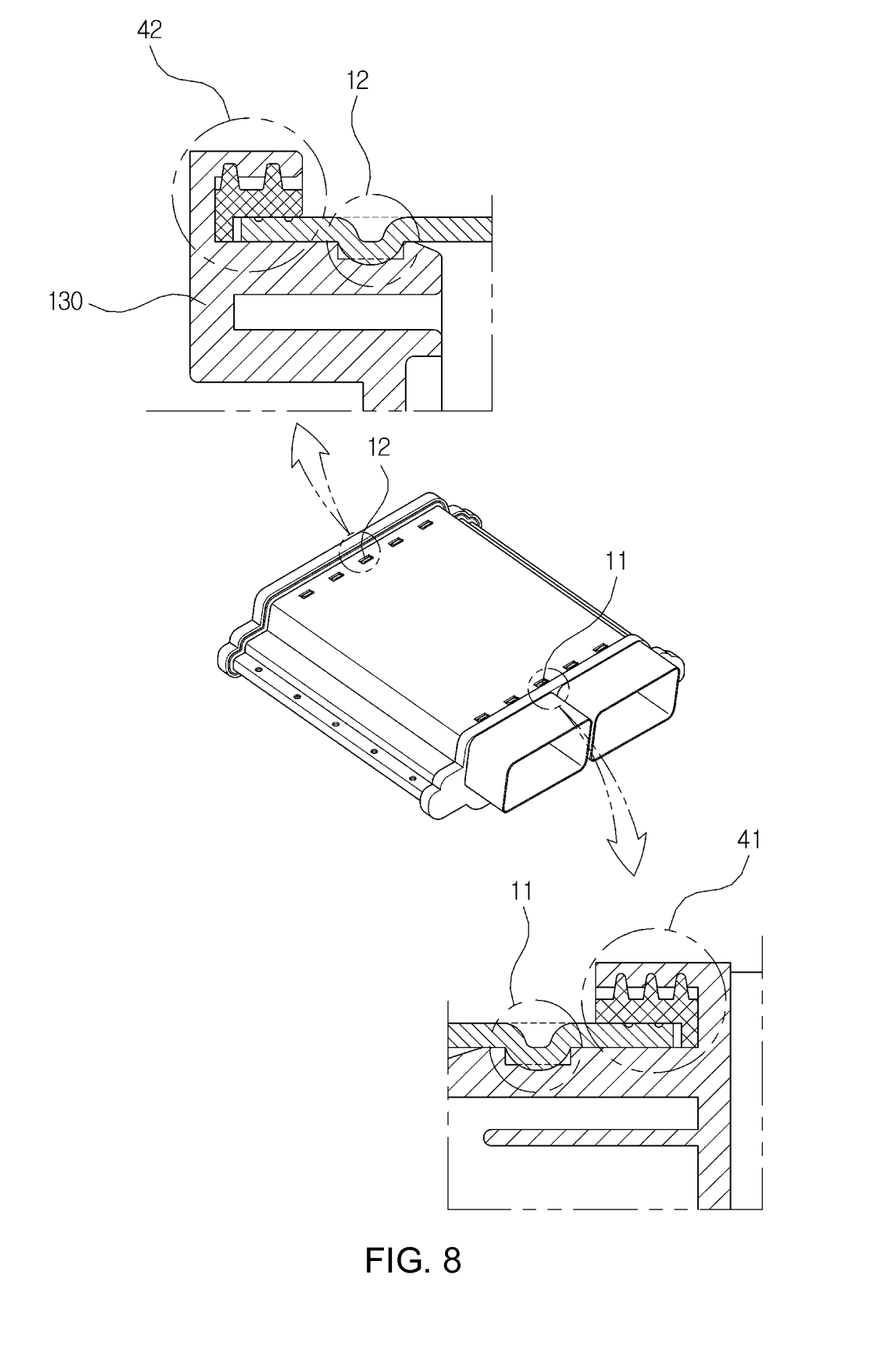

FIGS. 5 and 6 are an exploded perspective view and a coupling perspective view of the electronic control apparatus for a vehicle including a sealing structure according to the exemplary embodiment of the present disclosure and FIGS. 7 and 8 are cross-sectional views illustrating the sealing structure included in the electronic control apparatus for a vehicle according to the exemplary embodiment of the present disclosure.

To adhere the PCB to the housing, the electronic control apparatus of the existing one-piece slot type needs to use a bolt, a nut, or other clamping parts at the inside or the outside of the housing during the assembling process, and as a result, in the case of using the fastening means, the assembling time and process may be increased.

However, as illustrated in FIGS. 5 and 6, when the electronic control apparatus of the one-piece slot type uses the coupling member 30 according to the exemplary embodiment of the present disclosure, the PCB may be fixed to the housing by a much simpler process than the related art and the assembling time may be shortened.

In this case, the pressing force is formed so that the physically deformed corresponding surface 11 presses the coupling member 30 and the PCB 110 adheres to the bottom side of the housing 100. Due to the structural characteristics of the coupling member 30 as described above, a natural pressing force may be generated at the PCB 110. Further, since the PCB 110 may adhere to the housing 100 using the coupling member 30, the heat generated from the PCB 110 may be smoothly emitted to the outside through the housing 100.

When the PCB 110 is inserted into the housing 100, as illustrated in FIG. 7, the coupling part 122 of the connector cover 120 is formed with a depressed groove 1221. The depressed groove is pressed by each corresponding surface 11 formed by physically deforming the corresponding surface 11 of the housing contacting the depressed groove 1221 which is formed at the coupling part 122. The coupling part 122 and the housing 100 are coupled with each other by each formed corresponding surface 11 of the housing 100 and the pressed depressed groove.

Meanwhile, a sealing member 41 may be inserted between the coupling part 122 and the housing 100. Here, the sealing member 41 is made of a rubber or synthetic resin material and may seal a coupled surface between the coupling part 122 and the housing 100 in a L shape form to enclose the coupled surface between them. An inner surface of the coupling part 122 may have a U shape structure 1222 enclosing a portion of the inserted sealing member 41 so as to seal the coupled portion between the coupling part 122 and the housing 100.

Meanwhile, the case in which the housing 100 has opened both sides and a rear surface thereof is coupled by a back cover 130 will be described.

When the back cover 130 is inserted into the housing 100, as illustrated in FIG. 7, the back cover 130 is formed with the depressed groove. The depressed groove is pressed by the corresponding surface 12 formed by physically deforming each corresponding surface 12 of the housing contacting the depressed groove which is formed at the back cover 130. The back cover 130 and the housing 100 are coupled with each other by the formed corresponding surface 12 of the housing 100 and the pressed depressed groove.

Meanwhile, the sealing member 42 may be inserted between the back cover 130 and the housing 100. Here, the sealing member 42 is made of a rubber or synthetic resin material and may seal a coupled surface between the back cover 130 and the housing 100 in a L shape form to enclose the coupled surface between them. An inner surface of the back cover 130 may have a U shape structure 1222 enclosing a portion of the inserted sealing member 42 so as to seal the coupled portion between the back cover 130 and the housing 100.

As illustrated in FIGS. 7 and 8, the inner surfaces of the coupling part 122 and the back cover 130 have a structure enclosing a portion of the sealing member 41 which is inserted between the coupling part 122 and the housing 100. Here, the inner surfaces of the coupling part 122 and the back cover 130 may have teeth.

Figure 9:
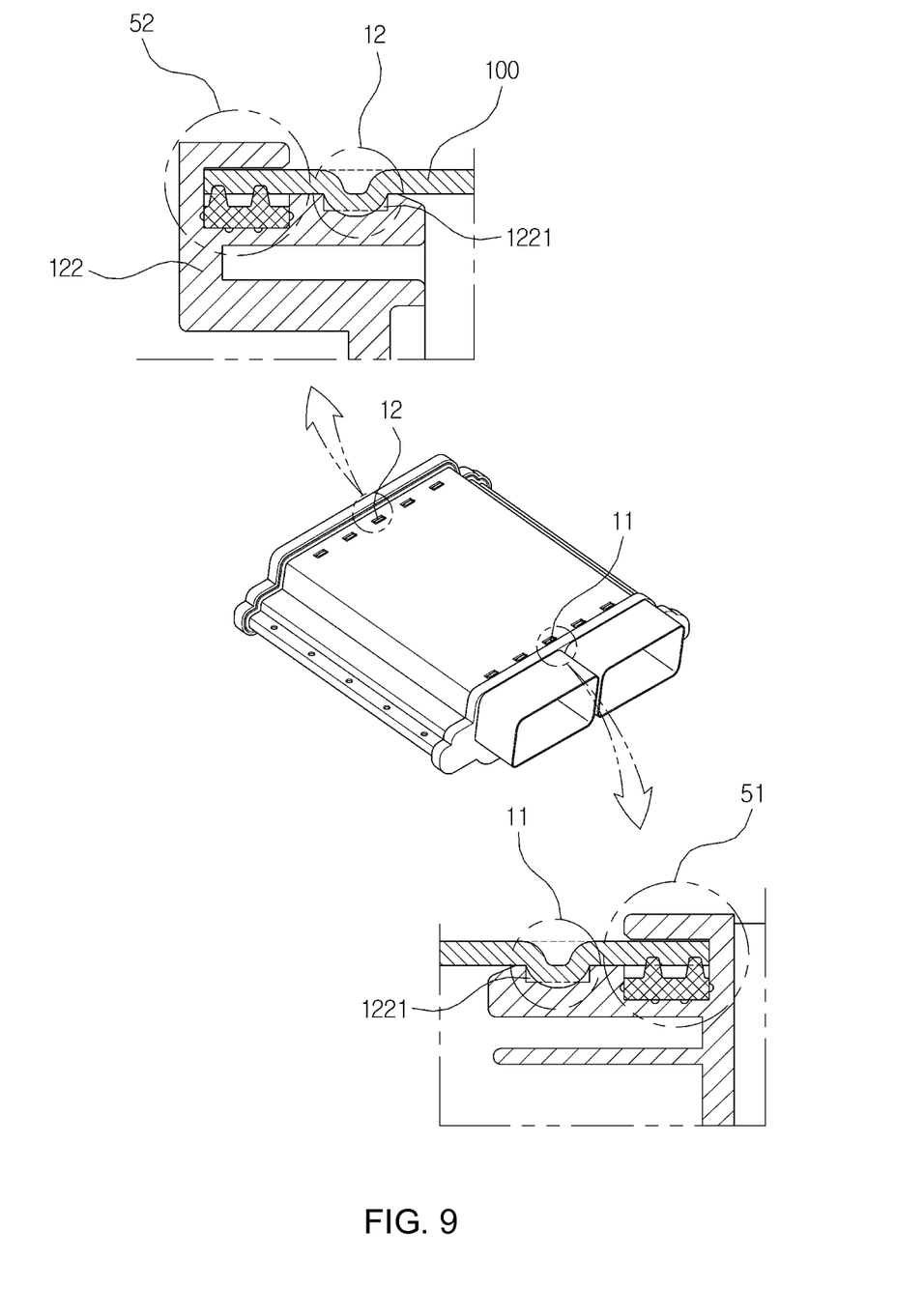
FIG. 9 is a cross-sectional view illustrating a sealing structure included in an electronic control apparatus for a vehicle according to another exemplary embodiment of the present disclosure.

FIG. 9 is a cross-sectional view illustrating a sealing structure included in an electronic control apparatus for a vehicle according to another exemplary embodiment of the present disclosure.

When the PCB 110 is inserted into the housing 100, even in the exemplary embodiment illustrated in FIG. 9 and similar to that illustrated in FIG. 7, the coupling part 122 of the connector cover 120 is formed with the depressed groove 1221. The depressed groove is pressed by each corresponding surface 11 formed by physically pressing the corresponding surface 11 of the housing contacting the depressed groove 1221 which is formed at the coupling part 122. The coupling part 122 and the housing 100 are coupled with each other by each formed corresponding surface 11 of the housing 100 and the pressed depressed groove.

Meanwhile, a sealing member 51 may be inserted between the coupling part 122 and the housing 100. Here, the sealing member 51 is made of a rubber or synthetic resin material and may seal an inner space of the housing which is formed by coupling the coupling part 122 with the housing 100. In the exemplary embodiment of the present disclosure previously described with reference to FIG. 7, the inner surface of the coupling part 122 has a U shape structure 1222 enclosing a portion of the inserted sealing member 41 so as to seal the coupled portion between the coupling part 122 and the housing 100 and an outer side of the housing is formed with a sealing space (outer seal), but according to the exemplary embodiment of the present disclosure illustrated in FIG. 9, an inner side of the housing in which the coupling part 122 is coupled with the housing 100 is formed with an sealing space (inner seal).

Similarly, when the back cover 130 is inserted into the housing 100, even in the exemplary embodiment illustrated in FIG. 9 like being similar to that illustrated in FIG. 7, the back cover 130 is formed with the depressed groove. The depressed groove is pressed by the corresponding surface 12 formed by physically deforming each corresponding surface 12 of the housing contacting the depressed groove which is formed at the back cover 130. The back cover 130 and the housing 100 are coupled with each other by the formed corresponding surface 12 of the housing 100 and the pressed depressed groove. Further, the sealing member 52 may be inserted between the back cover 130 and the housing 100. Here, the sealing member 52 is made of a rubber or synthetic resin material and may seal the inner space of the housing which is formed by coupling the back cover 130 with the housing 100. In the exemplary embodiment of the present disclosure previously described with reference to FIG. 7, the inner surface of the back cover 130 has the U shape structure enclosing a portion of the inserted sealing member 42 so as to seal the coupled portion between the back cover 130 and the housing 100 and an outer side of the housing is formed with the sealing space (outer seal), but according to the exemplary embodiment of the present disclosure illustrated in FIG. 9, an inner side of the housing in which the back cover 130 is coupled with the housing 100 is formed with the sealing space (inner seal).

According to another exemplary embodiment of the present disclosure, the back cover and the housing may be coupled with each other by welding and the sealing member may not be inserted between the back cover and the housing.

Meanwhile, according to another exemplary embodiment of the present disclosure, the sealing members which are inserted into the sealing spaces between the coupling part and the housing and between the back cover and the housing may be applied with a liquid phase sealant.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present disclosure, as well as various alternatives and modifications thereof. As is evident from the foregoing description, certain aspects of the present disclosure are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An electronic control apparatus for a vehicle, comprising:
    a printed circuit board (PCB), the PCB electrically controlling each part of the vehicle and having at least one fixed hole;
    a connector cover comprising a connector part electrically connected and coupled with the PCB and a coupling part;
    a housing, the housing receiving the PCB inserted in a slide form; and
    at least one coupling member fastened with the at least one fixed hole of the PCB,
    wherein the PCB is inserted into the housing and the PCB adheres to a bottom side of the housing by the at least one coupling member which is pressed by physically deforming each corresponding surface of the housing corresponding to the at least one coupling member,
    wherein the at least one coupling member comprises a head formed with a groove and a body, and wherein the groove is pressed to the physically deformed corresponding surface of the housing.

2. The apparatus of claim 1, wherein the at least one coupling member includes a head formed with a groove and the head is wider than the at least one fixed hole.

3. The apparatus of claim 1, wherein the coupling part of the connector cover is provided with a groove and a corresponding surface of the housing contacting the groove formed at the coupling part, and the corresponding surface of the housing is physically deformed to press the groove to couple the coupling part with the housing.

4. The apparatus of claim 1, wherein a sealing member is inserted between the coupling part and the housing and an inner surface of the coupling part has a structure enclosing a portion of the inserted sealing member so as to seal a coupled portion between the coupling part and the housing.

5. The apparatus of claim 4, wherein the inner surface of the coupling part having a structure enclosing a portion of the inserted sealing member has teeth.

6. The apparatus of claim 4, wherein the sealing member is made of a rubber, synthetic resin, or liquid phase sealant material and seals a coupled surface between the coupling part and the housing in a L shape form to enclose the coupled surface therebetween.

7. A method for manufacturing an electronic control apparatus for a vehicle including a printed circuit board (PCB), a connector, and a housing, the method comprising:
    coupling the PCB electrically controlling each part of the vehicle with a connector cover;
    inserting the PCB into the housing in a slide form;
    inserting a sealing member between the connector cover and the housing,
    wherein the coupling part of the connector cover has a structure enclosing a portion of the inserted sealing member so that a coupled portion between the coupling part and the housing is sealed;
    forming at least one fixed hole on the PCB;
    after the coupling of the PCB with the connector cover, fastening the at least one fixed hole of the PCB with at least one coupling member, and inserting the PCB fastened with the at least one coupling member into the housing; and
    adhering the PCB to a bottom side of the housing by the at least one coupling member pressed by physically deforming each corresponding surface of the housing corresponding to the at least one coupling member,
    wherein the at least one coupling member comprises a head formed with a groove and a body, and wherein the groove is pressed to the physically deformed corresponding surface of the housing.

8. The method of claim 7, wherein the head is wider than the at least one fixed hole.

9. The method of claim 7, further comprising:
    forming a groove at the coupling part of the connector cover; and
    physically deforming a corresponding surface of the housing contacting the groove to press the groove and couple the coupling part with the housing.

* * * * *